US006982440B2

(12) United States Patent
Van Zeghbroeck et al.

(10) Patent No.: US 6,982,440 B2
(45) Date of Patent: Jan. 3, 2006

(54) SILICON CARBIDE SEMICONDUCTOR DEVICES WITH A REGROWN CONTACT LAYER

(75) Inventors: Bart J. Van Zeghbroeck, Boulder, CO (US); John T. Torvik, Louisville, CO (US)

(73) Assignee: PowerSicel, Inc., Boulder, CO (US)

( * ) Notice: Subject to any disclaimer, the term of this patent is extended or adjusted under 35 U.S.C. 154(b) by 0 days.

(21) Appl. No.: 10/339,040

(22) Filed: Jan. 9, 2003

(65) Prior Publication Data

US 2003/0157745 A1 Aug. 21, 2003

Related U.S. Application Data

(60) Provisional application No. 60/358,440, filed on Feb. 19, 2002.

(51) Int. Cl.
 *H01L 31/0328* (2006.01)

(52) U.S. Cl. ............... 257/183; 257/12; 257/24; 257/194; 257/200

(58) Field of Classification Search .......... 257/11, 257/12, 15, 24, 37, 183, 190, 194, 200
See application file for complete search history.

(56) References Cited

U.S. PATENT DOCUMENTS

| | | | |
|---|---|---|---|
| 4,945,394 A | | 7/1990 | Palmour et al. ............... 357/34 |
| 5,186,718 A | * | 2/1993 | Tepman et al. ............. 29/25.01 |
| 5,266,503 A | | 11/1993 | Wang et al. ................... 437/24 |
| H1637 H | | 3/1997 | Offord et al. ................. 437/173 |
| 5,798,293 A | * | 8/1998 | Harris ........................ 438/459 |
| 5,914,611 A | | 6/1999 | Cheng ........................ 324/719 |
| 6,127,695 A | | 10/2000 | Harris ........................ 257/77 |
| 6,180,958 B1 | | 1/2001 | Cooper, Jr. ................... 257/7 |
| 6,181,200 B1 | | 1/2001 | Titizian et al. ............... 330/66 |
| 6,218,254 B1 | | 4/2001 | Singh et al. ................ 438/364 |
| 6,228,665 B1 | | 5/2001 | Griffith et al. ............... 438/14 |
| 6,303,475 B1 | | 10/2001 | Suvorov et al. ............ 438/519 |
| 6,313,482 B1 | | 11/2001 | Baliga ........................ 257/77 |
| 6,323,506 B1 | | 11/2001 | Alok ........................ 257/77 |
| 6,329,675 B2 | | 12/2001 | Singh et al. ................. 257/77 |
| 6,331,931 B1 | | 12/2001 | Titizian et al. ........... 361/306.3 |
| 6,410,396 B1 | * | 6/2002 | Casady et al. ............. 438/312 |

OTHER PUBLICATIONS

Article entitled "Silicon Carbide Bipolar Transistor" by W. V. Munch and P. Hoeck published in *Solid State Electronics*, 1978, vol. 21, pp. 479–480, Pergamon Press, Great Britain.
Excerpt from textbook entitled *Volume V Introduction to Microelectronic Fabrication*, pp. 71–73, author Richard C. Jaeger, Auburn University, published by Addison–Welsey Publishing Company, reprinted with corrections May, 1993.
U.S. Appl. No. 10/360,662, filed Feb. 7, 2003, entitled "Method of Fabricating Self–Aligned Silicon Carbide Semiconductor Devices", and further identified as Attorney Docket No. 50033–00005.

(Continued)

*Primary Examiner*—Hoai Pham
*Assistant Examiner*—Wai-Sing Louie
(74) *Attorney, Agent, or Firm*—Marsh Fischmann & Breyfogle LLP

(57) ABSTRACT

Silicon carbide semiconductor devices having regrown layers and methods of fabricating the same in a self-aligned manner. According to one aspect of the invention, the method includes growing at least one layer of silicon carbide on a substrate, removing the device from a growth chamber to perform at least one processing step, and regrowing another layer of silicon carbide on the at least one layer. According to one embodiment of the invention, the regrown layer may be a heavily doped contact layer for the formation of low resistivity ohmic contacts.

37 Claims, 8 Drawing Sheets

OTHER PUBLICATIONS

U.S. Appl. No. 10/630,238, filed Jul. 30, 2003, entitled "Wide Bandgap Semiconductor Device Construction", and further identified as Attorney Docket No. 50033–00006.
Paper entitled "Selective Growth of 4H–SiC on 4H–SiC Substrates Using a High Temperature Mask" by C. Li, J. Seiler, I. Phat, and T.P. Chow, ECSE Department, Rensselaer Polytechnic Institute, Troy, NY 12180–03590, USA, Materials Science Forum vols. 457–460 (2004) pp 185–188. Online at http://www.scientific.net. Copyright 2004, Trans Tech Pubilcations, Switzerland.

* cited by examiner

SILICON CARBIDE SEMICONDUCTOR DEVICES WITH A REGROWN CONTACT LAYER

RELATED APPLICATIONS

This patent application claims priority from U.S. patent application Ser. No. 60/358,440, that was filed on Feb. 19, 2002, and that is entitled "BIPOLAR TRANSISTOR WITH REGROWN BASE CONTACT," and further claims priority from U.S. patent application Ser. No. 60/358,318, that was filed on Feb. 19, 2002, and that is entitled "BIPOLAR TRANSISTOR WITH SELF-ALIGNED ION IMPLANTED BASE CONTACT." The entire disclosure of U.S. patent application Ser. No. 60/358,440 and U.S. patent application Ser. No. 60/358,318 is incorporated herein by reference.

FIELD OF THE INVENTION

The present invention generally relates to silicon carbide (SiC) semi-conductor devices, and in particular, to SiC devices having a regrown layer.

BACKGROUND OF THE INVENTION

Silicon carbide is a semiconductor material with desirable material properties for constructing power devices. These material properties include among other things, a wide bandgap, a high thermal conductivity, high breakdown field strength, and a high electron saturation velocity. One example of such a power device is a bipolar junction transistor (BJT). BJT's are well-known and frequently used semiconductor devices that are generally defined by two back-to-back p-n junctions formed in a semiconductor material in close proximity. In operation, current enters a region of the semiconductor material adjacent one of the p-n junctions called the emitter. Current exits the device from a region of the material adjacent the other p-n junction called the collector. The collector and emitter have the same conductivity type and include a thin layer of semiconductor material having the opposite conductivity positioned between them, referred to as the base.

One of the requirements for an operable and useful BJT device is an appropriate semiconductor material from which it can be formed. The most commonly used material is silicon (Si), with recent attention being paid to materials such as gallium arsenide (GaAs) and indium phosphide (InP). While the potential of SiC is recognized, appropriate techniques for producing devices is lacking, because the requirements of specific devices, such as devices utilized in radio frequency (RF) applications, are often difficult to achieve using SiC. For instance, performance optimization in a device, such as a BJT for an RF power amplifier, requires minimizing base resistance, maximizing power densities, and minimizing parasitics. To accomplish these characteristics, the geometry and spacing of the base and the emitter, as well their respective contacts must be carefully controlled. Furthermore, such devices require careful control of the conductivity and thickness of the emitter, base, and collector layers, as well as the parasitic base-collector capacitance to achieve desired oscillation frequencies and power gains. In the case of a device, such as a BJT made from SiC, the high base sheet resistance and difficulty in making low-resistivity ohmic contacts, (due to the large mismatch between the valence band energy of SiC and the work function of common metals), makes such devices difficult to produce.

To achieve the above-described geometries and spacing in a SiC device, it is desirable to construct the device in a self-aligned manner. Self-alignment in this context means that the relative spacing of features of the device, such as contacts, is automatically controlled by the processing sequence and process parameters, rather than by the careful alignment prior to exposure of a photo sensitive layer. Unfortunately, self-alignment is problematic in SiC devices due to the high processing temperatures typically involved. For example, ion implantation of a highly-doped contact region to form a self-aligned contact layer is the commonly utilized approach in the semiconductor industry to achieve self-alignment. This approach typically utilizes an implant mask to define the ion implanted regions of the device. However, when this technique is applied to SiC devices, the subsequent anneal process required to restore the crystal structure after implantation must be performed at very high temperatures (generally 1400–1800° C.). Such high temperatures require that the masking material utilized for the implantation be removed during the anneal process such that the implant mask can no longer be used to self-align other features of the device.

SUMMARY OF THE INVENTION

In view of the foregoing, a primary object of the present invention is to provide improved methods of forming SiC devices. Another object of the present invention is to provide a method of forming self-aligned SiC devices. Another object of the present invention is to provide a method of forming self-aligned contacts on SiC devices. A related object of the present invention is to provide a device and method of forming self-aligned low-resistivity ohmic contacts to the base portion of a BJT SiC device as part of the processing.

In the context of the present invention, the term "grown" refers to an initial formation (growth/deposition) of a layer of material on a substrate in a growth chamber. Also, in the context of the present invention, the term "regrowth" refers to formation (growth/deposition) of a layer of material subsequent to the initial growth and after the device, including the initial formation, is removed from the original growth chamber. Thus, regrowth refers to formation of a layer subsequent to a removal and reintroduction of the device to the original or a different growth chamber.

One or more of the above objectives and additional advantages may be realized by a first aspect of the present invention, which provides a method of forming a semiconductor device from SiC. The method includes the steps of growing at least one layer of SiC material and regrowing at least one other layer of SiC material on a substrate. Various refinements exist of the features noted in relation to the subject first aspect of the present invention. Further features may also be incorporated in the subject first aspect as well. These refinements and additional features may exist individually or in any combination. For instance, the step of regrowing the layer of SiC material may include regrowing a heavily doped base contact layer. Advantageously, the regrowth of the contact layer eliminates the need for the above described anneal step as ion implantation is not utilized to form the contact layer of the present device. According to this characterization, the contact layer may be selectively regrown to form individual contact areas for the formation of low resistivity ohmic contacts. Alternatively, the step of regrowing the layer of SiC material may include regrowth of a uniform layer and selective etching to form the individual contact areas for the formation of low resistivity ohmic contacts.

According to another feature, the method may further include growing a first and second layer of SiC material on the substrate and regrowing the contact layer of SiC material on the second layer. According to this characterization, the first layer may include one of a first and second conductivity type, while the second layer includes one of the first and second conductivity types that is different from the first layer conductivity type.

According to another feature, the method may further include the step of forming at least one ohmic contact on the contact layer. The step of forming the ohmic contact may in turn include the steps of depositing a metal layer on the contact layer and forming at least one ohmic contact on the metal layer.

According to another feature, the method may further include the step of automatically controlling the relative spacing of the first, second, and contact layers as a result of the processing sequence and processing parameters to achieve a self-aligned device having self aligned contacts. According to this characterization, SiC devices including without limitation a junction, a transistor, a diode, thyristor, etc. may be formed in a self-aligned manner that include a low resistivity contact layer for the formation of ohmic contacts thereon.

One or more of the above objectives and additional advantages may be realized by a second aspect of the present invention, which provides a method of forming a bipolar junction transistor from SiC. The method includes the steps of forming a first layer of SiC material having a first conductivity type on a substrate, a second layer of SiC material having a second conductivity type on the first layer, and a third layer of SiC material on the second layer having the first conductivity type. The method further includes exposing a portion of the second layer of SiC material and regrowing a contact layer of SiC material on the exposed portion of the second layer of SiC material. Advantageously, as with the first aspect, the regrowth of the contact layer eliminates the need for the anneal step as ion implantation is not utilized to form the contact layer of the present device.

Various refinements exist of the features noted in relation to the subject second aspect of the present invention. Further features may also be incorporated in the subject second aspect as well. These refinements and additional features may exist individually or in any combination. For instance, the method may further include the step of automatically controlling the relative spacing of the first, second, and contact layers as a result of the processing sequence and processing parameters to achieve a self-aligned device. Furthermore, the forming step may include epitaxially growing a stack including a base layer disposed between an emitter layer and a collector layer, wherein the base layer has one of a p-type and an n-type conductivity, and the collector and emitter layers have one of the p-type and the n-type conductivities opposite the base layer conductivity. Subsequent to growth of the base, collector, and emitter layers, the method may include patterning at least one pillar, e.g. mesa structure, in the emitter or third layer. According to this characterization, the patterning step exposes at least a portion of the second or base layer of the transistor. According to one embodiment of the method, the step of regrowing the contact layer may include regrowing the contact layer in at least the exposed areas of the base or second layer. According to another embodiment of the present method, the contact layer may be regrown on the third layer and exposed portion of the second layer. In the latter case, the method may further include the removal of the contact layer from the third layer. In either of the above cases, the method may further include the step of forming at least one ohmic contact on the contact layer. The step of forming the ohmic contact may include depositing a metal layer on the contact layer and forming at least one ohmic contact on the metal layer.

One or more of the above objectives and additional advantages may be realized by a third aspect of the present invention, which provides a semiconductor device fabricated from SiC. The device includes a substrate, at least one layer grown from SiC material on the substrate, at least one other layer regrown from SiC material, and at least one ohmic contact. According to this characterization, the regrown layer may include conductivity as regrown, free from any subsequent annealing, greater than the layer on which it is regrown.

Various refinements exist of the features noted in relation to the subject third aspect of the present invention. Further features may also be incorporated in the subject third aspect as well. These refinements and additional features may exist individually or in any combination. For instance, the regrown layer may be a heavily doped contact layer for the device. In addition, the device may be a junction, a transistor, a diode, a thyristor etc., and may be formed in a self-aligned manner as described above.

One or more of the above objectives and additional advantages may be realized by a fourth aspect of the present invention, which provides a bipolar junction transistor fabricated from Silicon Carbide (SiC). The device includes a collector layer formed from SiC material on a substrate having a first conductivity type, a base layer formed from SiC material on the collector layer having a second conductivity type, an emitter formed from SiC material on the base layer having the first conductivity type, and a regrown base contact layer formed from SiC material on the base layer. The device may further include at least one ohmic contact.

Various refinements exist of the features noted in relation to the subject fourth aspect of the present invention. Further features may also be incorporated in the subject fourth aspect as well. For instance, the device may be an n-p-n structure wherein the emitter and collector have a n-type conductivity and the base has an p-type conductivity or the device may be a p-n-p structure with the emitter and collector have an p-type conductivity and the base having a n-type conductivity. These refinements and additional features may exist individually or in any combination. Furthermore, additional aspects, advantages and applications of the present invention will be apparent to those skilled in the art upon consideration of the following.

DETAILED DESCRIPTION

Figure 1:
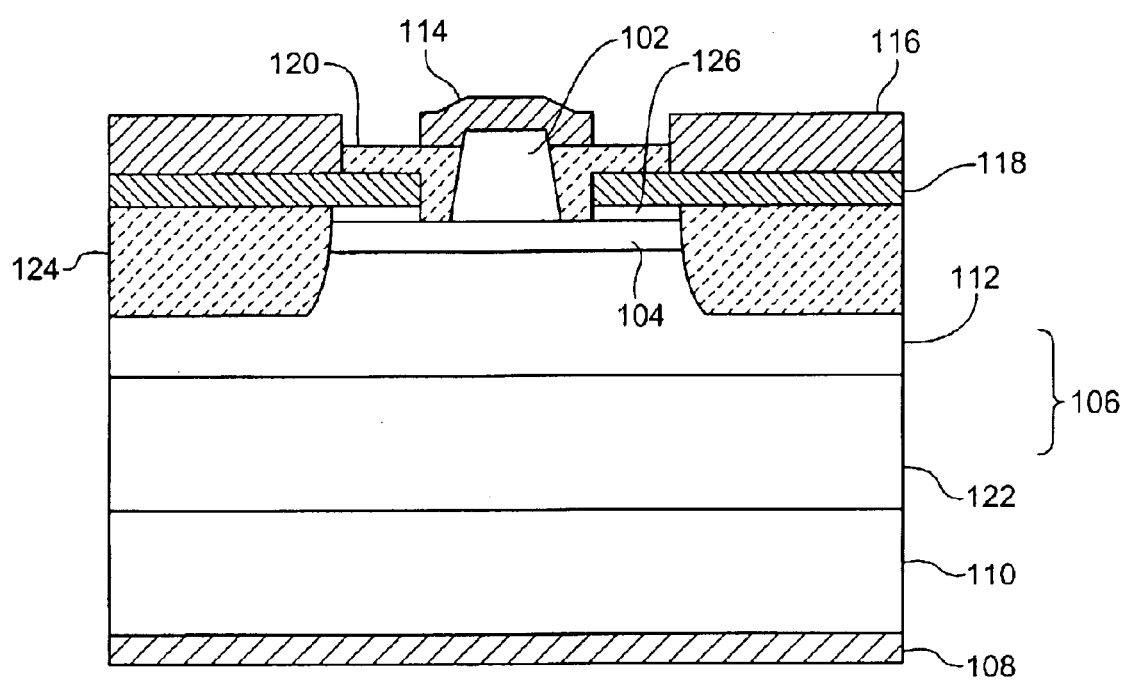
FIG. 1 illustrates an example of a SiC device formed in accordance with the principles of the present invention.

Reference will now be made to the accompanying drawings, which at least assist in illustrating the various pertinent features of the present invention. In this regard, the following description is presented for purposes of illustration and description and is not intended to limit the invention to the form disclosed herein. Consequently, variations and modifications commensurate with the following teachings, and skill and knowledge of the relevant art, are within the scope of the present invention. The embodiments described herein are further intended to explain the best modes known of practicing the invention and to enable others skilled in the art to utilize the invention in such, or other embodiments and with various modifications required by the particular application(s) or use(s) of the present invention. As such, the following description sets forth an exemplary SiC BJT structure and associated processes that involve regrowth, self-alignment, and other features and advantages commensurate with the present invention.

As noted above, a difficulty associated with forming self-aligned SiC devices relates to the high temperature annealing process required when ion implantation is utilized to form a base contact area. In this case, the mask materials cannot withstand the high temperatures and therefore are not usable to align the emitter and base contacts. The present invention addresses this apparent obstacle through regrowth, and in one particular example regrowth of a base contact layer, thereby avoiding ion implantation and the required high temperature annealing. The regrown base contact layer in turn, reduces the base contact resistance for the formation of self-aligned ohmic contacts with low specific contact resistivity.

An ohmic contact is a metal semiconductor contact having negligible contact resistance relative to the bulk or spreading resistance of the semiconductor device. For example, an ohmic contact may be a resistive contact area that permits a metal, such as aluminum, to be used as an interconnecting metal from one region to another. It is generally required, however, that an ohmic contact not change the performance of a device, which it is a part of, where a voltage drop across the ohmic contact is small, compared to a voltage drop across an active region of the device.

The following description discloses an example of a SiC device, namely BJT transistor 100, and method of making the same. It will be appreciated that the present example is provided for purpose of illustration and that other devices are possible and contemplated in accordance with the present invention. For instance, one skilled in the art will readily appreciate that the described principles may be applied to construct devices such as a junction, a diode, a thyristor, or a transistor from SiC.

The transistor 100 is fabricated using a base regrowth process to provide a thin heavily doped base contact layer. The base contact layer in turn, reduces the base contact resistance for the formation of ohmic contacts with low specific contact resistivity. In this regard, the base contact layer may be formed into individual low resistivity base contacts underneath a base contact metal to increase the maximum oscillation frequency of the transistor 100. Advantageously, the present method is particularly useful in forming discrete wide bandwidth SiC BJTs for use in devices such as RF power amplifiers for wireless communication and radar purposes, as well as lower-frequency power devices for applications such as in power conditioning and traction control.

Referring to FIG. 1, a bipolar junction transistor 100 is shown that includes three distinct SiC semiconductor regions, namely, an emitter region 102, a base region 104, and collector region 106 (formed from sub-collector layer 122 and collector layer 112). Unless otherwise specified, the forming processes involved in fabricating the transistor 100 may include, but are not limited to, various CVD processes such as microwave plasma CVD, RF plasma CVD, photo-CVD, thermal CVD, and MOCVD, various deposition processes such as electron beam evaporation, and sputtering, among others, as well as various etch processes including reactive ion etching and high temperature anneal and oxidation processes. In this regard, the transistor 100 can be made both with n-p-n and p-n-p conductivity type for the emitter layer 102, base layer 104, and collector layer 106 respectively, but the n-p-n structure is preferred as it includes superior transport properties due to higher electron mobility compared to hole mobility. It should also be noted that SiC crystallizes in over 150 polytypes or crystal structures, although the most common structures include those known as 3C, 4H, and 6H, where "C" means 'cubic' and "H" means 'hexagonal.' While the principles of the present invention apply equally to at least those structures known as 3C, 4H, and 6H, preferably for RF applications, a BJT made from 4H SiC is deemed the most useful, as 4H-SiC includes higher electron mobility along the C-axis, e.g. as compared to 6H-SiC.

According to one embodiment of the transistor 100, that is especially useful for RF applications, the base layer 104 may be a thin and heavily doped layer, e.g. having a nominal thickness of less than 200 nm and a doping density in the range of $2–8\times10^{18}$ cm$^{-3}$. According to this characterization, the thickness and doping of the emitter layer 102 may be 200 nm and $1\times10^{19}$ to $4\times10^{19}$ cm$^{-3}$ respectively, while the thickness and doping of the collector layers 106 may be 1000 nm to 3000 nm and $2\times10_{15}$ to $8\times10^{16}$ cm$^{-3}$ respectively.

As noted above, to reduce base contact resistance, the transistor 100 includes a heavily doped regrown base contact layer 126, e.g. ($10^{19+}$ cm$^{-3}$>p>mid–$10^{20}$ cm$^{-3}$). The base contact layer 126, in turn, permits the formation of ohmic contacts with low specific contact resistivity with a base contact metal 118. In this regard, the regrown base contact layer 126 forms a low-resistivity tunneling contact, while the active base layer 104 remains moderately doped to optimize transport properties and gain. Obtaining as-deposited ohmic contacts is another advantage of the regrown base contact layer 126 provided the doping density is high (~mid–$10^{20}$ cm$^{-3}$). Advantageously, the formation of the regrown base contact layer 126 simplifies the processing steps during the fabrication of the transistor 100 by eliminating the high temperature anneal typically required during the formation of SiC BJT structures. Finally, transistor 100 further includes an n+ type substrate 110, a collector contact 108, an emitter contact 114, and passivation layers 120 and 124. Alternatively, the transistor 100 can be fabricated on a semi-insulating SiC substrate so that multiple transistors can be made on the same substrate without having a common collector contact. The collector layers of these transistors are electrically isolated by either removing the collector layer through etching or by making the collector insulating though ion implantation and/or oxidation. Separate ohmic contacts are made to the individual collectors of each of these transistors.

As will be set forth in more detail below, the fabrication process for a SiC BJT according to this embodiment, e.g. transistor 100, generally includes: (1) growth of an n-p-n stack, (2) patterning and etching to define the emitter, (3) base regrowth to define the base contact layer, (4) selective oxidation to define the individual base contacts, (5) planarization, and (6) metal contact formation. In this regard, the n-p-n stack may be grown using conventional SiC CVD with nitrogen and aluminum as the donor and acceptors, respectively. The patterning and etching may be performed using, for example, conventional photolithography and reactive ion etching (RIE) using CF$_4$ at 100 mT and 0.21 W/cm$^2$. The base regrowth may be performed by any suitable method according to the principles disclosed herein. In one example, the base regrowth may be performed using CVD to minimize the etching of material while it is heated to the growth temperature. Alternatively, the base regrowth may be performed by molecular beam epitaxy (MBE), which typically requires lower growth temperature than MOCVD. The base contact metal 118 may be defined using selective oxidation with a silicon nitride mask. Planarization may be accomplished using spin-on glass and etch-back using etching and/or polishing. In one embodiment of the transistor 100, Ni may be used for the n-type emitter contact 114 and collector contact 108, and Al/Ti for the p-type base contact 118. It should also be noted that in some cases, the contacts, e.g. 118, may need a high temperature anneal (up to 1000° C.) depending on the base and emitter contact layer doping densities. Passivation of the transistor 100 may be achieved using silicon oxide or nitride.

Figure 2:
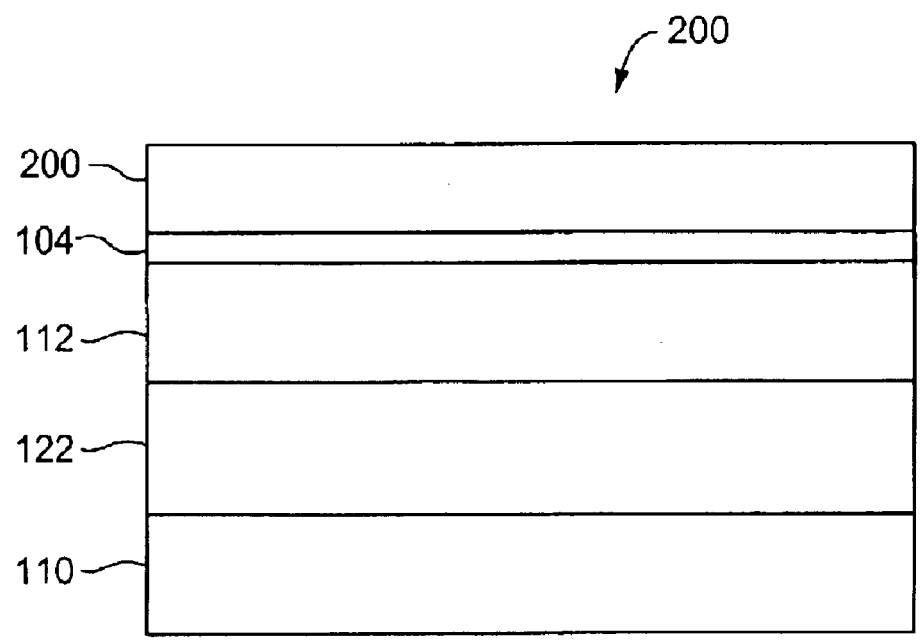
FIGS. 2–21 illustrate, in step-by-step fashion, a process for forming the device of FIG. 1.

An example of a generally corresponding process of forming transistor 100, is shown in step-by-step fashion in FIGS. 2–20. Referring first to FIG. 2, there is shown an n-p-n stack 200 epitaxially grown as described above. The stack 200 includes the n-type SiC substrate 110 having a doping density, for example, of $10^{18}$ cm$^{-3}$, the n-type SiC subcollector layer 122 having a doping density, for example, of $10^{18}$ cm$^{-3}$, the SiC n-type collector layer 112 having a doping density, for example, of $2 \times 10^{16}$ cm$^{-3}$, the SiC p-type base layer 104 having a doping density, for example, of $2 \times 10^{18}$ cm$^{-3}$ and the SiC n-type emitter layer 200 having a doping density, for example, of $10^{19}$ cm$^{-3}$.

Figure 3:
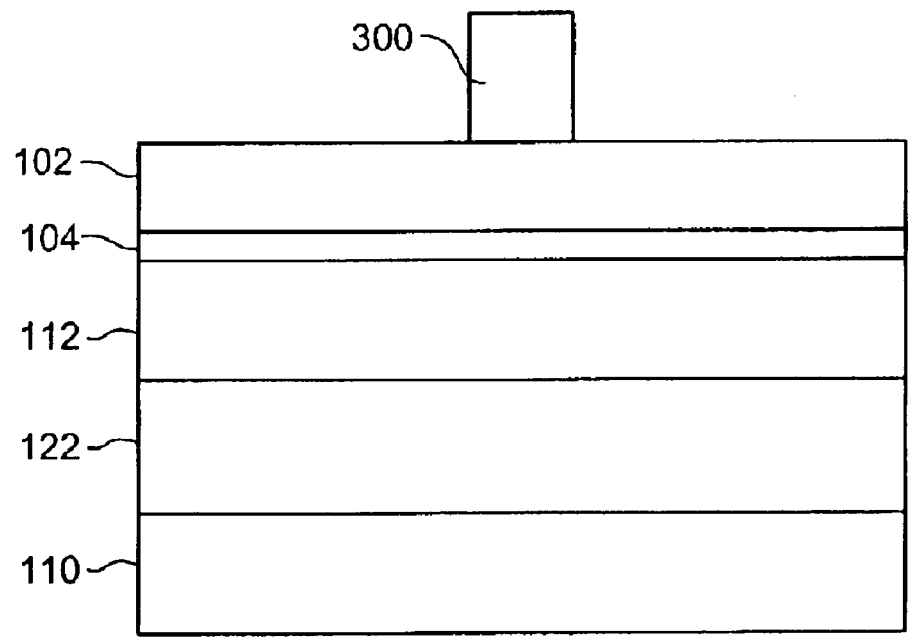

FIG. 3 illustrates the formation of a photoresist mask 300. The photoresist mask 300 may be formed by conventional photolithographic processing, such as by using an exposure tool and mask. In one example, the photoresist mask 300 may be formed by spin-coating a layer of photoresist materials onto the emitter layer 102, baking, and then selectively exposing the photoresist layer to a form of radiation such as ultraviolet light, electrons, or X-rays.

Figure 4:
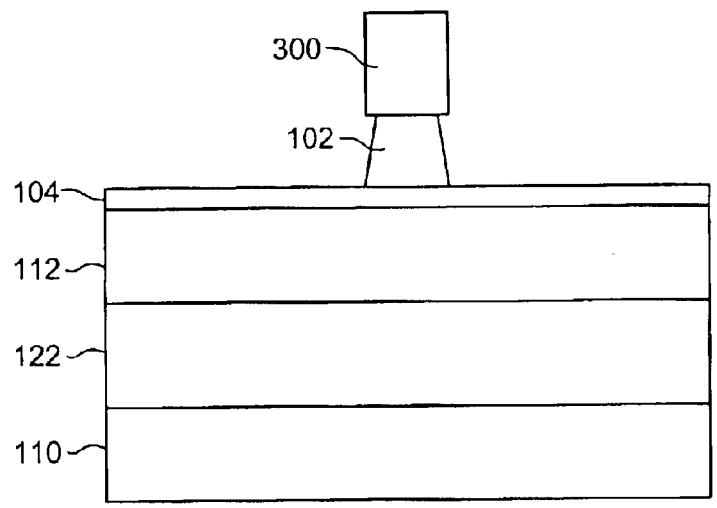

As shown in FIG. 4, an etching, such as by RIE, or similar process, may be used to remove a portion of the n-type emitter layer 200 to form an emitter mesa 102. As will be appreciated by those skilled in the art, RIE is a dry etching process that permits highly anisotropic etch profiles and may be performed, for example, using CF$_4$ at 100 mT and 0.21 W/cm$^2$. In this regard, the mesa shape of emitter mesa 102 may be achieved through accurate control of the physical and chemical mechanisms involved with the RIE. For instance, controlling the gas ratios of ions, the flow rate of ions, the chamber pressure, and power/voltage applied to accelerating ions and other factors, may be used to control the RIE rate to form the tapered sidewalls of emitter mesa 102.

Figure 5:
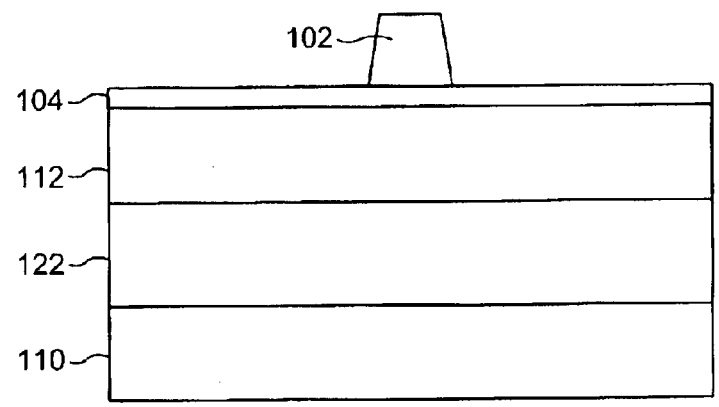
Figure 6:
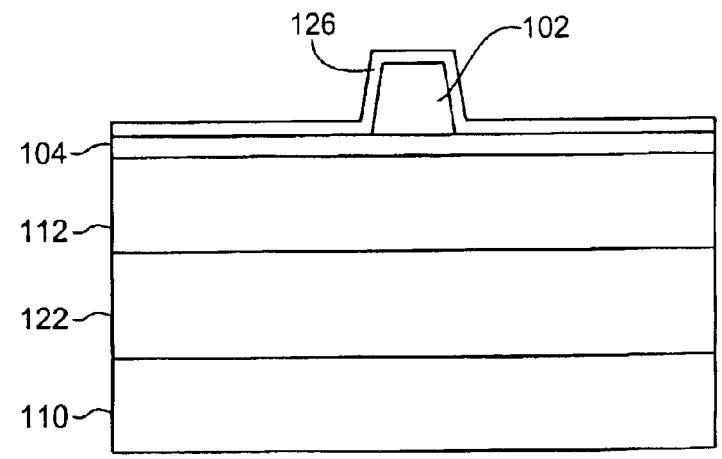

FIG. 5 illustrates the emitter mesa 102 after an RIE etch, as described above, to remove the photoresist mask 300. FIG. 6 illustrates the transistor device 100 including the regrown base contact layer 126. According to this example, the regrown base contact layer 126 includes the same conductivity type, e.g. p+, as the underlying base layer 104. In one example of the transistor 100, the base contact layer 126 regrowth and patterning may be performed using CVD with the addition of silane and methane or propane to a carrier gas during heating, e.g. typically in the range of 1350 and 1650 degrees. Advantageously this provides for minimal etching during heating to growth temperature (<30 nm) as the silicon-to-carbon (Si/C) ratio within the growth reactor strongly affects dopant incorporation for an epitaxial layer grown on a 4H SiC, e.g. (0001) Si-face basal plane substrate.

According to this characterization, the regrowth is an epitaxial process that brings together atomic silicon and atomic carbon to form the regrown SiC base contact layer 126. The regrowth process forms a crystalline SiC formed on the surface of the base layer 104 that may be built layer by layer to form the base contact layer 126. In this regard, epitaxial deposition may be utilized to control the thickness and doping level of the regrown contact layer 126. Furthermore, accurately controlling the conductivity type and carrier concentration of the contact layer 126 provides for the subsequent consistent formation of ohmic contacts with the layer 126. Also advantageously, it will be appreciated that according to this method, the contact layer 126 includes conductivity as deposited, free from any subsequent annealing, greater than that of the base layer 104.

In an alternative example of the regrowth process, the regrown base contact layer 126 may be selectively and/or individually fabricated. For instance, the photoresist 300 may be turned into a carbon mask by heating in a controlled oxygen-free atmosphere that may be utilized during the regrowth of the base contact layer 126. Further, in this regard, carbon sidewalls on the sides of the emitter mesa 102 may be utilized in combination with the carbon mask to ensure that the emitter mesa 102 is isolated from the regrown contact layer 126. As will be appreciated, such a sidewall may be formed by a conformal deposition of carbon followed by an anisotropic etch. After the regrowth, the regrown base contact layer 126 as well as the carbon mask may be covered with a conformal CVD-deposited silicon nitride layer that may be used as a nitride mask for selective removal of portions of the regrown layer 126, from the emitter mesa 102, by thermal oxidation. Alternatively, the regrowth of the base contact layer 126 may be performed using other materials as for example, a tungsten mask.

Figure 7:
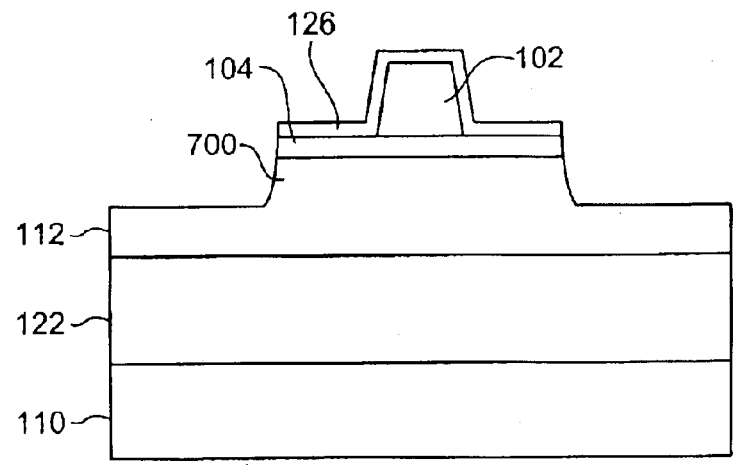
Figure 8:
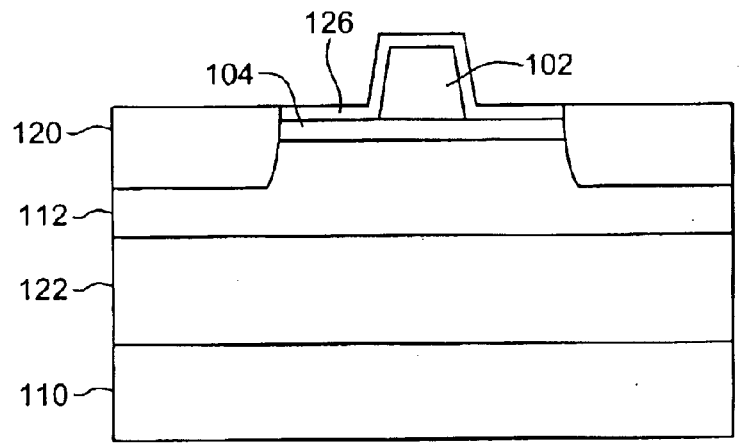

Continuing with the above example, FIG. 7 illustrates the result of an RIE etch of a portion of regrown layer 126, a portion of base layer 104, and a portion of collector layer 112 to form an isolation mesa 700. The isolation mesa 700 isolates the emitter-base junction from the remainder of the device 100. As illustrated in FIG. 8, the area around the isolation mesa 700 may then be refilled with an oxide, e.g. SiO$_2$, using for example, a CVD or any other suitable process to form the passivation layer 120.

Figure 9:
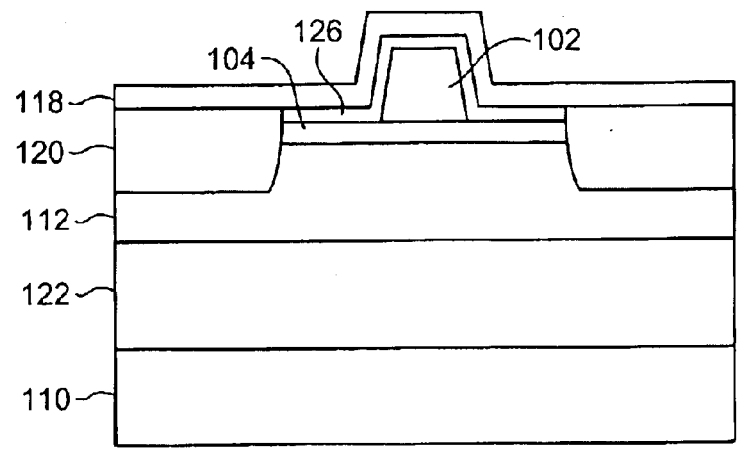

FIG. 9 illustrates a subsequent deposition of a base contact metal 118. In one example of the transistor 100, the base metal may be Ti/Al. Alternatively, it will be appreciated that other metals may be utilized, including but not limited to, tantalum (Ta), molybdenum (Mo), tungsten (W), chromium (Cr), and silicon (Si). A physical vapor deposition (PVD) such as sputtering or a similar process may be used to deposit the base contact metal 118 onto the oxide layer 120 and regrown base contact layer 126.

Figure 10:
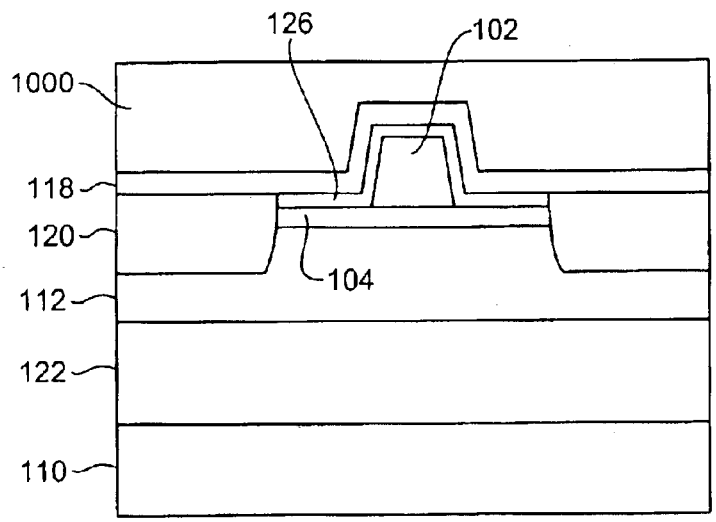

As illustrated in FIG. 10, the base contact metal 118 is covered by a polyamide planarization layer 1000. The planarization layer 1000 may be formed by a polymer with a planarizing property such as polyamide, for example, spun over the base contact metal 118, and then planarized by etch back or chemical-mechanical polishing (CMP). Although polyamide is set forth in this example, it will be appreciated that other organic resins such as polyimide, BCB (benzocyclobutene), or the like may alternatively be used to form the planarization layer 1000.

Figure 11:
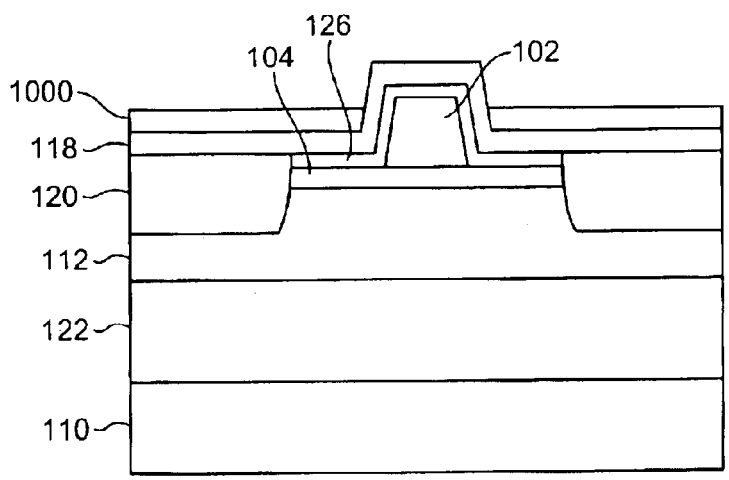
Figure 12:
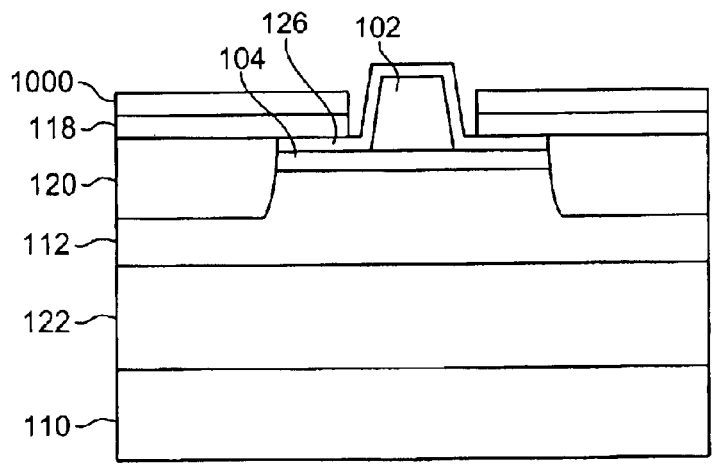
Figure 13:
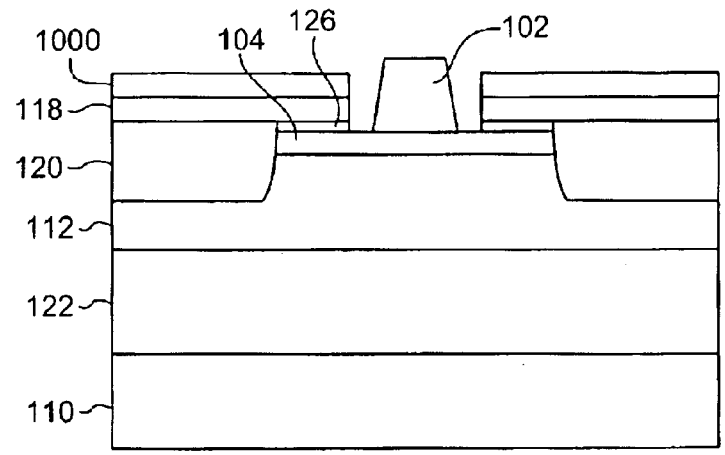

FIG. 11 illustrates the transistor 100 after partial removal of the planarization layer 1000. To facilitate the self-aligned construction of the device 100, the polymer is etched down below the top level of the emitter mesa 102, to expose an upper portion of the base contact metal 118 protruding above and along the side the emitter mesa 102. As illustrated in FIG. 12, this permits the etching of the base contact metal 118, which is highly selective against the regrown layer 126, to remove the exposed base contact metal 118 without damage to the regrown contact layer 126. A further SiC etch may then be performed, as illustrated in FIG. 13, to remove the exposed base contact layer 126 from the emitter mesa 102 and unprotected portion of the surface of the regrown layer 126. As will be appreciated by those skilled in the art, the degree of anisotropy and the lateral etch ratio may each be controlled to accurately etch away the portion of the regrown layer 126 covering the emitter mesa 102 without damaging the emitter mesa 102 itself.

Figure 14:
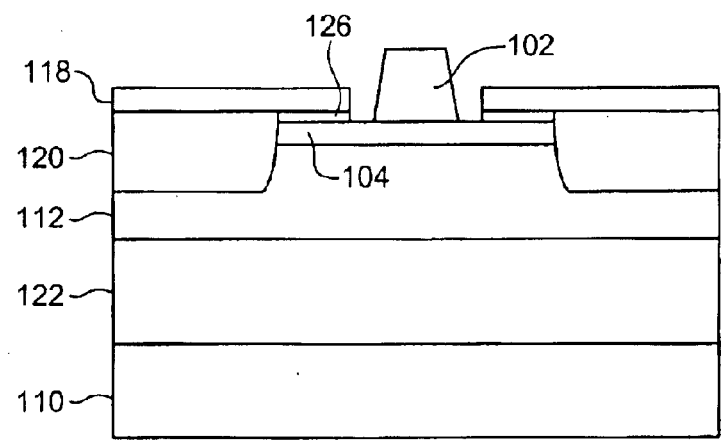
Figure 15:
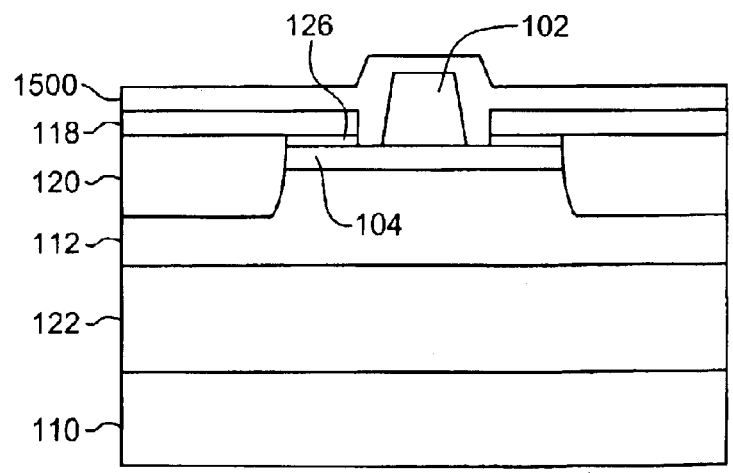
Figure 16:
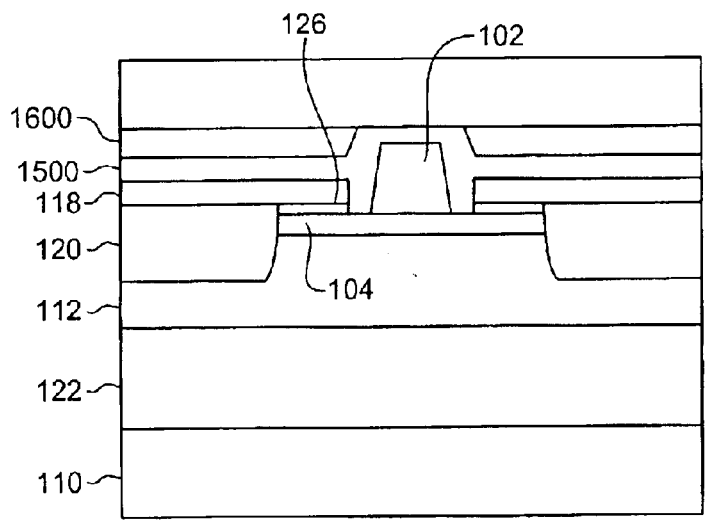
Figure 17:
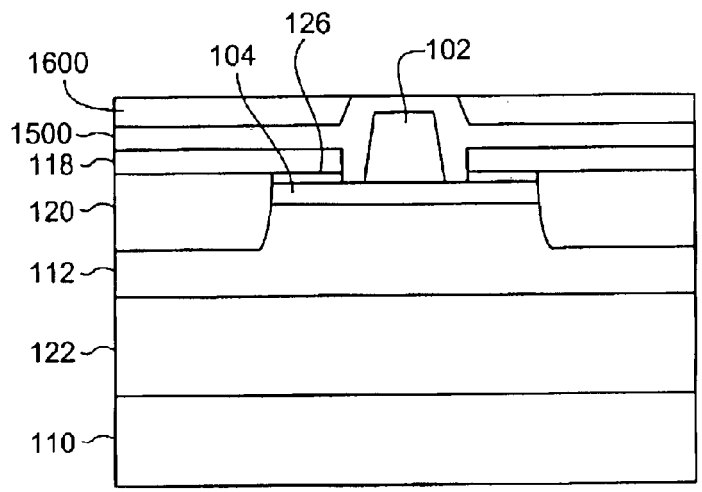
Figure 18:
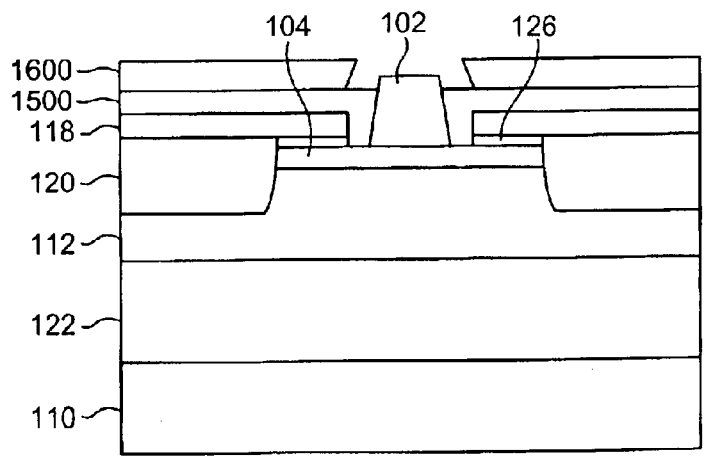
Figure 19:
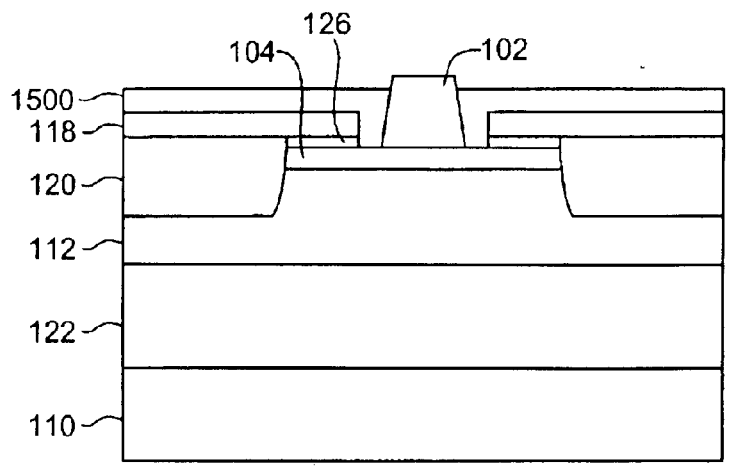
Figure 20:
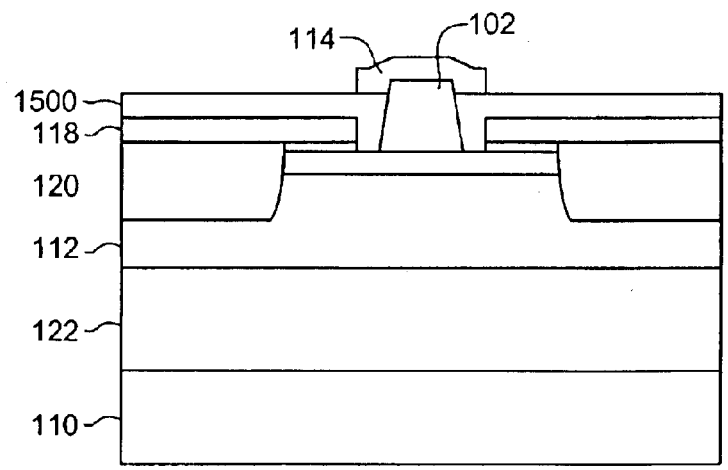

FIG. 14 illustrates the results of a further etch to remove the remaining polyamide layer 1000 to expose the underlying base contact metal 118. As will be appreciated, the removal and/or patterning of the layer 1000 may be performed in several ways including plasma etching (or reactive ion etching, RIE), direct photo patterning of photosensitive polyamides, and others. After removal of the remaining polyamide layer 1000, an oxide layer, for example, a CVD deposited $SiO_2$ layer 1500 may be deposited, as illustrated in FIG. 15. As illustrated in FIG. 16, another polyamide planarization layer 1600 may then be deposited on the oxide layer 1500 to form a conformal coating and facilitate the self-alignment of the device 100. The planarization layer 1600 may be cured, for example, at approximately 200 degrees C., which causes the polyamide to flow so that a minimal surface topology results despite the presence of the emitter mesa 102. As illustrated in FIG. 17, the planarization layer 1600 may then be partially removed, for example by anisotropic oxygen RIE, to expose the top of the emitter mesa 102 and oxide layer 1500. This permits an $SiO_2$ etch to expose emitter mesa 102, as illustrated in FIG. 18. As illustrated in FIG. 19, the remaining polyamide layer 1600 may then be removed for application of a self-aligned emitter contact 114 formed thereon, as illustrated in FIG. 20.

Figure 21:
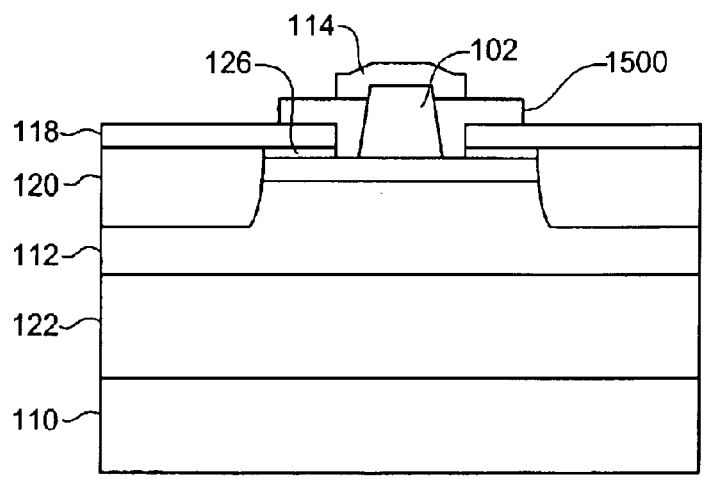

As illustrated in FIG. 21, a further $SiO_2$ etch may be performed to expose the base contact metal 118 such that the wiring metal 116 may be formed thereon in a self-aligned manner. For example, a base contact, such as base contact 118 of transistor 100, may be formed to encircle the emitter mesa 102 to maximize the base contact area for a given mesa area. Alternatively, base contacts may be individually formed on the base layer 104. As noted above, the oxide layer 1500 forms a passivation layer for transistor 100, to prevent leakage of current by isolating the silicon carbide of the emitter 102.

Some examples of base and emitter contact metals include without limitation, nickel (Ni) for the n-type emitter contact 114 and aluminum alloy (e.g., Al/Ti) for the base contact 118. In this regard, the contacts may be either a single layer or a multilayer electrode. High-temperature annealing of the base and emitter contacts 118 and 114 respectively may also be required in some cases depending on doping densities of the base contact layer 126 and the emitter 102. It should also be noted that the metal used for the base and emitter contacts 118 and 114 respectively is not limited to nickel and aluminum alloy, but generally, a high work function metal is preferred for such ohmic contacts.

It will be appreciated that the above example of the transistor 100 is one of many types of semiconductor devices that may be constructed in accordance with the principles of the present invention. Furthermore, those skilled in the art will appreciate variations of the disclosed processes as well as other similar processes that may be utilized in accordance with the teachings of the present invention to form self-aligned SiC devices having a regrown contact area. Those skilled in the art will further appreciate variations of the above-described embodiments that fall within the scope of the invention. As a result, the invention is not limited to the specific examples and illustrations discussed above, but only by the following claims and their equivalents.

What is claimed:

1. A method of forming a semiconductor device from Silicon Carbide (SiC), the method comprising the steps of:

growing on a substrate at least a first layer of SiC material having a p-conductivity type in a growth chamber;

removing the device from the growth chamber to perform at least one process on the device; and subsequent to said removing, regrowing a layer of SiC material having said p-conductivity type on the first layer.

2. The method of claim 1, the method comprising:

forming at least one ohmic contact on the device.

3. The method of claim 1, wherein the regrowing step comprises:

regrowing a highly doped contact layer.

4. The method of claim 3, the method comprising:

subsequent to growing the first layer, growing a second layer on the first layer.

5. The method of claim 4, wherein the first layer includes a first conductivity type and the second layer includes a second conductivity type different from the first conductivity type.

6. The method of claim 5, the method further comprising:

automatically controlling relative spacing of the first layer, the second layer, and the contact layer as a result of a processing sequence to construct the device in a self-aligned manner.

7. The method of claim 5, wherein the contact layer includes the second conductivity type and has a conductivity, free from any subsequent annealing, greater than that of the second layer.

8. The method of claim 3, the method comprising:

selectively removing portions of the contact layer to form individual contact areas.

9. The method of claim 1, wherein the regrowing step comprises:

regrowing the layer of SiC material on selective portions of the device.

10. The method of claim 1, further comprising forming a radio frequency power device including said first layer and said regrown layer.

11. The method of claim 1, further comprising forming a p-n junction including said first layer and said regrown layer.

12. The method of claim 1, further comprising forming a transistor including said first layer and said regrown layer.

13. The method of claim 1, further comprising forming a thyristor including said first layer and said regrown layer.

14. A method of forming a bipolar transistor in Silicon Carbide (SiC), the method comprising:

growing a first layer of SiC material having a first conductivity type on a substrate, a second layer of SiC material having a second conductivity type on the first layer, and a third layer of SiC material having the first conductivity type on the second layer;

exposing a portion of the second layer of SiC material; and regrowing a layer of SIC material on the exposed portion of the second layer of SiC material.

15. The method of claim 14, the method further comprising:
forming at least one ohmic contact on the regrown layer.

16. The method of claim 14, the method further comprising:
automatically controlling relative spacing of the first layer, the second layer, the third layer, and the regrown layer as a result of a processing sequence to construct the transistor in a self-aligned manner.

17. The method of claim 14, wherein the regrown layer includes the second conductivity type and has a conductivity, free from any subsequent annealing, greater than that of the second layer.

18. The method of claim 14, wherein the exposing step comprises:
patterning at least one pillar in the third layer.

19. The method of claim 15, wherein the regrowing step comprises:
regrowing the layer of SiC material on the third layer and the exposed portion of the second layer; and
removing the regrown layer from the third layer.

20. The method of claim 14, wherein the regrowing step comprises:
selectively regrowing the layer of SiC material on the exposed portion of the second layer.

21. The method of claim 16, wherein the step of automatically controlling relative spacing comprises:
utilizing planarization to expose predetermined portions of the device to one of an etching process and a deposition process.

22. The method of claim 19, wherein the step of forming the at least one ohmic contact comprises:
prior to removing the regrown layer from the third layer, depositing a metal layer on the contact layer;
removing the regrown layer and the metal layer to expose the third layer; and
forming the at least one ohmic contact on the metal layer.

23. The method of claim 22, the method comprising:
forming another ohmic contact on the exposed third layer.

24. A method of forming a bipolar junction transistor from Silicon Carbide (SiC), the method comprising the steps of:
forming a multi-layer structure including a base layer formed from SiC disposed between an emitter layer formed from SiC and a collector layer formed from SiC, wherein the base layer has a first conductivity and the emitter and collector layers have a second conductivity opposite the base layer conductivity;
patterning at least one mesa structure in the emitter layer, wherein the mesa structure-patterning step exposes a portion of the base layer;
regrowing a contact layer of SiC on the exposed portion of the base layer; and
forming at least one ohmic contact on the contact layer.

25. The method of claim 24, the method further comprising:
automatically controlling relative spacing of the base layer, the emitter layer, collector layer, the contact layer, and the at least one ohmic contact as a result of a processing sequence to construct the device in a self-aligned manner.

26. The method of claim 25, wherein the step of automatically controlling relative spacing comprises:
utilizing planarization to expose predetermined portions of the device to one of an etching process and a deposition process.

27. The method of claim 25, comprising:
providing an ohmic contact on the mesa structure.

28. A method as set forth in claim 1, further comprising the step of patterning said first layer of SiC prior to said regrowing.

29. A method for use in forming a Silicon Carbide (SiC) product, comprising the steps of:
forming, on a first substrate, a first bipolar device including a first layer and a third layer of SiC material, each having a first conductivity type, and a second layer of SiC material having a second conductivity type, said second layer being disposed between said first and third layers; and
forming, on said first substrate, a second bipolar device including a fourth layer and a sixth layer of SiC material, each having a first conductivity type, and a fifth layer of SiC material having a second conductivity type, said fifth layer being disposed between said fourth and sixth layers,
wherein said first and second bipolar devices are substantially electrically isolated from one another.

30. A method as set forth in claim 29, wherein each of said steps of forming a first bipolar device and forming a second bipolar device comprises forming a transistor.

31. A method as set forth in claim 29, wherein each of said steps of forming a first bipolar device and forming a second bipolar device comprises forming a device on a semi-insulating substrate.

32. A method as set forth in claim 29, wherein each of said steps of forming a first bipolar device and forming a second bipolar device comprises forming a device on a SiC substrate.

33. A method as set forth in claim 29, wherein said step of forming a first bipolar device comprises forming a first collector contact and said step of forming a second bipolar device comprises forming a second collector contact electrically separated from said first collector contact.

34. A method as set forth in claim 33, further comprising the step of electrically isolating said first collector contact from said second collector contact.

35. A method as set forth in claim 34, wherein said step of electrically isolating comprises etching a collector layer.

36. A method as set forth in claim 34, wherein said step of electrically isolating comprises processing a portion of a collector layer such that said portion is rendered insulating.

37. A method as set forth in claim 29, wherein said steps of forming a first bipolar device and forming a second bipolar device are conducted concurrently.

* * * * *